United States Patent [19]

Bogholtz et al.

[11] 3,958,155
[45] May 18, 1976

[54] PACKAGED MAGNETIC DOMAIN DEVICE HAVING INTEGRAL BIAS AND SWITCHING MAGNETIC FIELD MEANS

[75] Inventors: Wilhelm E. Bogholtz, Wappingers Falls; Louis J. Bosch, Hopewell Junction; Robert A. Downing, Poughkeepsie; James R. Kiseda, Hopewell Junction; Albert A. Lennon, Jr., Poughquag; Alfred A. Rifkin, Wappingers Falls; Edgar W. Scott, Poughkeepsie, all of N.Y.

[73] Assignee: International Business Machines Corporation, Armonk, N.Y.

[22] Filed: June 29, 1973

[21] Appl. No.: 375,274

Related U.S. Application Data

[63] Continuation of Ser. No. 265,034, June 21, 1972.

[52] U.S. Cl. .................. 317/101 CM; 340/174 MA
[51] Int. Cl.² ......................................... H05K 5/00
[58] Field of Search ............. 317/101 CM, 101 CE, 317/101 D, 101 A; 29/604; 340/174 MD, 174 MA, 174 TF, 174 AG, 174 EB, 174 VA

[56] References Cited
UNITED STATES PATENTS

| | | | |
|---|---|---|---|
| 3,205,298 | 9/1965 | Kalt | 317/101 D |
| 3,347,203 | 10/1967 | Engleman et al. | 340/174 MA |
| 3,404,215 | 10/1968 | Burks et al. | 317/101 A |
| 3,500,346 | 3/1970 | Takeuchi et al. | 29/604 |
| 3,508,214 | 4/1970 | Visschedisk | 340/174 PM |
| 3,516,077 | 6/1970 | Bobeck et al. | 340/174 |
| 3,529,303 | 9/1970 | Bobeck et al. | 340/174 |
| 3,711,841 | 1/1973 | Geusic et al. | 340/174 TF |

*Primary Examiner*—David Smith, Jr.
*Attorney, Agent, or Firm*—James M. Thomson

[57] ABSTRACT

A multi-layered package for a magnetic domain device including self-contained in-plane switching magnetic field coils surrounding one or more magnetic domain device chips and a permanent magnet surrounding the switching magnetic field coils. The switching coils are formed by two printed circuit layers, each layer comprising an insulating substrate having striped conductive patterns orthogonally oriented relative to each other on the opposite surfaces of the insulating layer. The ends of the striped conductors on one printed circuit layer are connected to the ends of the corresponding striped pattern on the other printed circuit layer so as to form one of the switching coils. The ends of the other pair of striped conductive patterns are similarly connected to form the second switching coil. The magnetic domain device chips are placed inside the formed switching coils which, in turn, are surrounded by the permanent magnet.

6 Claims, 4 Drawing Figures

PACKAGED MAGNETIC DOMAIN DEVICE HAVING INTEGRAL BIAS AND SWITCHING MAGNETIC FIELD MEANS

This is a continuation of application Ser. No. 265,034 filed June 21, 1972.

BACKGROUND OF THE INVENTION

1. Field of the Invention

The invention generally relates to magnetic domain devices and, more particularly, to a package for protecting such devices and for providing integral biasing and in-plane switching magnetic fields for the operation thereof.

2. Description of the Prior Art

As is well understood, magnetic domain devices employing permeable overlay patterns on a ferromagnetic cylindricaldomain-supporting film require a bias magnetic field perpendicular to the substrate as well as a switching magnetic field whose direction may be switched within the plane of the substrate for maintaining and for propagating, respectively, the cylindrical magnetic domains. Previously, all the magnetic domain devices utilized in a given installation were subjected to a single bias field and a single switching field, the latter of which was provided by an orthogonal pair of relatively bulky, relatively large current-carrying coils. The relatively large inductance and power requirements of such switching magnetic field coils present substantial loads to the current driving circuits which control the sequential energization and deenergization of the orthogonal coils and hinder the speed with which this is accomplished. Accordingly, it is desirable that the bulky, high inductance types of switching coils used in the prior art be eliminated and replaced by switching coils having minimum power requirements and permitting high speed current switching. It is further desirable that a self-contained unit be provided including the magnetic domain devices, in-plane switching coil and bias magnetic field means in an extremely dense and low cost package.

SUMMARY OF THE INVENTION

A packaged magnetic domain device is provided including self-contained in-plane switching magnetic field coils surrounding one or more magnetic domain device chips and a permanent magnet surrounding the switching magnetic field coils. The switching coils are formed by interconnected printed circuit wiring patterns and the permanent magnet is formed by two bar magnets separating two permalloy sheets. The permanent magnet provides a permanent bias magnetic field imparting a non-volatile characteristic to the data stored in the magnetic domain device chips. The switching coils and the magnetic domain device chips are formed into a repairable sub-assembly equipped with input-output mounting pins for establishing electrical connections with the switching coils and the magnetic domain device chips. The sub-assembly, in turn, is mounted between two permanent bar magnets and enclosed therein by two permalloy sheets extending between the bar magnets. One of the permalloy sheets is apertured to permit penetration by the input-output pins. The entire assembly is encased by a split plastic container having snap-fitting mating surfaces permitting easy access for repair purposes.

DESCRIPTION OF THE PREFERRED EMBODIMENT

Figure 1:
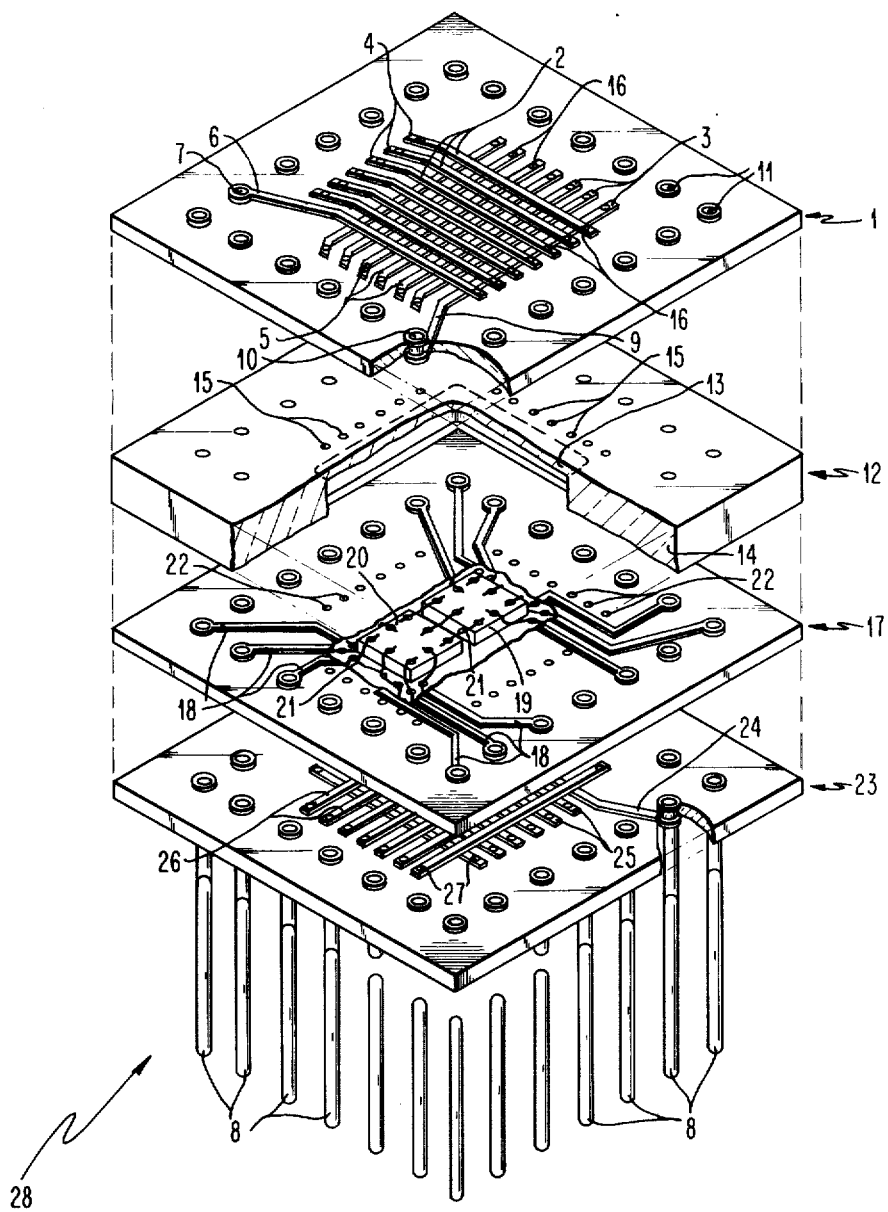
FIG. 1 is an exploded view in perspective of a prefered embodiment of a sub-assembly of the present invention.

Referring to FIG. 1, a conductively clad insulating substrate 1 is etched by conventional photolithographic techniques into a first striped conductive pattern 2 on the upper surface of substrate 1 and a second striped conductive pattern 3 on the lower surface thereof. One end 4 of each of the stripes 2 is skewed in accordance with the desired pitch of one in-plane switching magnetic field coil to be formed thereby. One end 5 of each of the stripes 3 is similarly skewed to provide the desired pitch of another in-plane switching magnetic field coil to be formed thereby. A conductive extension 6 on one of the stripes 2 establishes a connection with plated via hole 7 and one of the conductive input-output pins 8 when the device of FIG. 1 is assembled. A similar conductive extension 9 of one of the stripes 3 on the lower surface of substrate 1 connects to plated via hole 10 and to another of the conductive pins 8 upon assembly of the device of FIG. 1. Additional plated holes 11 are provided in substrate 1 to receive respective pins 8 for mechanical support purposes without establishing any electrical connections to the conductive pattern 2 or to the conductive pattern 3.

Spacer layer 12 is formed with a reduced thickness 13 in the region where the magnetic domain device chips are to be located in the assembled package. A greater thickness 14 is provided elsewhere. The reduced thickness 13 of layer 12 is provided with apertures 15 which are in alignment with apertures 16 at the ends of conductive stripes 2 and 3 and through substrate 1.

Insulating layer 17 initially is provided with a conductive cladding and is selectively etched using standard photolithographic techniques to provide the printed wiring pattern 18 by which electrical connection is established to the magnetic domain device chips 19 and 20 which are bonded to substrate 17. Interconnections between terminal points on chips 19 and 20 and the conductive pattern 18 preferably are established by a conductively clad, thin, flexible insulating sheet such as the material sold under the trade name "Mylar". The sheet is selectively etched into a pattern of interconnections 21 which are soldered between respective terminal points on chips 19 and 20 and the conductive pattern 18 on layer 17. Alternatively, "flying lead" wire connectors may be provided in lieu of the flexible insulating sheet conductive pattern. Upon assembly, the conductive pattern 18 is connected to respective pins 8 other than those already communicating with conductive stripes 2 and 3. Apertures 22 are provided in layer 17 in alignment with apertures 15 in overlying spacer 12.

Preferentially etched conductive clad substrate 23 is formed in a manner similar to that discussed above in connection with substrate 1 with the exception that there are no skewed portions at the ends of the stripes such as portions 4 and 5 of stripes 2 and 3 of substrate 1. Two conductive extensions (of which extension 24 is visible in the drawing) connects one of the conductive stripes 25 and one of the conductive stripes 26 to respective pins 8. Apertures 27 are placed in the ends of conductive stripes 25 and 26 in alignment with apertures 22, 15 and 16 of overlying layers 17, 12 and 1.

Upon assembly of the layers shown in exploded view in FIG. 1, solder is injected into the apertures 16 and through the apertures 15 and 22 into apertures 26 to provide electrical conduction pathways between conduction stripes 3 and 26 and between conductive stripes 2 and 25 thereby forming a pair of orthogonally oriented coils for the establishment of an in-plane (in the plane of magnetic domain device chips 19 and 20) switching magnetic field when the coils are properly energized in sequence by current applied via respective pins 8 communicating with the coil ends. It will be noted that the switching coils are small in size consistent with existing printed circuit technology which presents minimum power requirements to the coil driving circuits (not shown) and facilitates the high speed magnetic switching of the in-plane magentic field.

Figure 2:
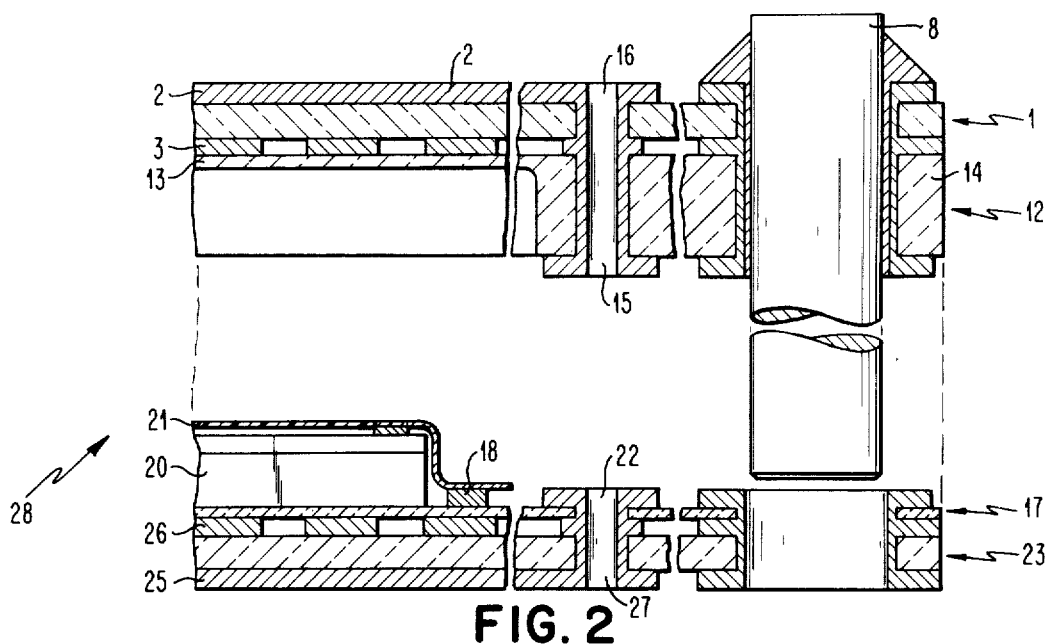
FIG. 2 is a typical cross sectional view of a partially assembled portion of the device of FIG. 1.
Figure 3:
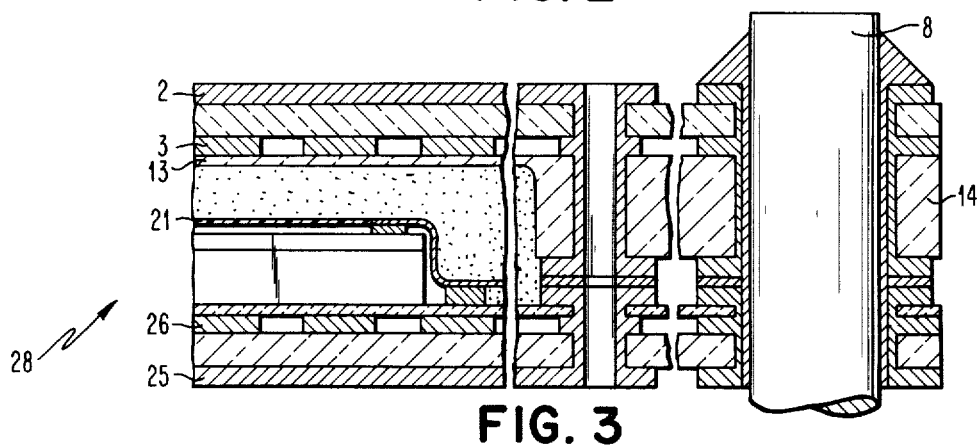
FIG. 3 is a cross sectional view of the portion of the device shown in FIG. 2 when fully assembled.

The manner in which the several layers of FIG. 1 are assembled may be understood in more detail by reference to FIG. 2. Substrate 1 and spacer 12 are fixed together with a suitable heat/pressure bonding material capable of withstanding soldering temperatures without deterioration. Substrate 23 and layer 17 are similarly heat/pressure bonded together. The mating apertures 16 and 15, the mating apertures 22 and 27 and the aligned apertures in layers 1, 12, 17 and 23 through which pin 8 passes are suitably sensitized and plated in a conventional manner in preparation for soldering. Pin 8 is inserted into the respective aligned apertures of substrate 1 and spacer 12 and soldered thereto. Then, the lower unit comprising substrate 23, layer 17 and connected magnetic domain device chip 20 is assembled in aligned relationship with the previously assembled upper unit comprising substrate 1 and spacer 12 as shown in FIG. 3. The aligned units are soldered together, the solder completely filling the aligned apertures 16, 15, 22 and 27 thereby establishing direct electrical connection between conductive stripe 2 and conductive stripe 25. Conductive stripes 3 are connected to conductive stripes 26 in similar fashion by solder-filled via holes (not shown in FIGS. 2 and 3). Preferably, the unoccupied cavity between spacer 12 and the interconnection sheet 21 is filled with an expandable foam to provide protective support for the magnetic domain device chips. It should be noted that the two units shown in disassembled relationship in FIG. 2 are fixed together by soldering as shown in FIG. 3 and may be readily separated for repair purposes as shown in FIG. 2 by desoldering. Thus, access may be gained for replacement of magnetic domain device chip 20, if necessary, without damaging the other components of the package.

Figure 4:
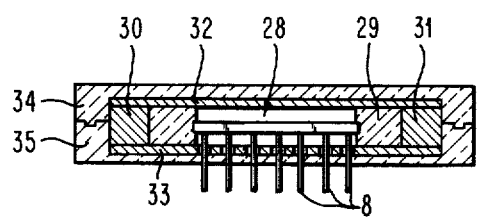
FIG. 4 is a cross sectional view of the fully assembled device shown in FIG. 1 when mounted within a protective package also providing a bias magnetic field.

The assembled and soldered unit as shown in FIG. 3 is represented by the reference numeral 28 in FIG. 4. The assembly 28 with its integrally mounted in-plane switching magnetic field coils and magnetic domain device chips is supported by non-magnetic spacer 29 such as a plastic spacer between permanent bar magnets 30 and 31. Permalloy sheets 32 and 33 uniformly distribute the magnetic field with respect to assembly 28. Sheet 33 is apertured to permit penetration by pins 8 without establishing electrical contact with pins 8. The bias magnetic field so formed is in a direction perpendicular to the plane of the magnetic domain device chips within the assembly 28. The package is completed by a split outer case of a suitable material such as plastic whose halves 34 and 35 are snap-fitted together permitting easy access to the interior components for repair purposes.

An important feature of the present invention is the non-volatile characteristic imparted to the magnetic domain device chips by virtue of the permanent bias magnetic field provided by magnets 30 and 31 and permalloy sheets 32 and 33. Assuming, for example, that the magnetic domain device chips provided data memory in a computer, the total package of FIG. 4 may be unplugged, picked up and transported to another memory location or stored without loss of data. In addition, the printed circuit conductive patterns employed in the formation of the in-plane switching magnetic field coils permit very flat field coil designs yielding very uniform field distribution over the magnetic domain device chip area whereby the cylindrical magnetic domain may be reliably propagated at high speed current switching rates.

While this invention has been particularly shown and described with reference to preferred embodiments thereof, it will be understood by those skilled in the art that various changes in form and details may be made therein without departing from the spirit and scope of the invention.

What is claimed is:

1. A magnetic domain device comprising:
   a magnetic domain device chip containing ferromagnetic cylindrical domain supporting material,
   a pair of printed circuit layers facing opposite surfaces of said chip;
   each said layer comprising:
   an insulating substrate having striped conductive patterns orthogonally oriented relative to each other on the opposite surfaces of said substrate,
   first conductive means connecting the ends of the striped conductors on one surface of one layer to the ends of the striped conductors on one surface of the other layer to form a first switching coil
   second conductive means connecting the ends of the striped conductors on the other surface of said one layer to the ends of the striped conductors on the other surface of said other layer to form a second switching coil orthogonally oriented relative to said first coil,
   a plurality of conductive pins,
   each said layer being apertured to permit penetration by said pins,
   third conductive means connecting the ends of each said coil to respective ones of said pins, and
   a permanent magnet surrounding said coils and providing a magnetic field perpendicular to said magnetic domain device chip.

2. The device defined in claim 1 wherein said first and second conductive means are solder connections made through aligned apertures in said pair of printed circuit layers.

3. The device defined in claim 1 and further including
   fourth conductive means connecting said magnetic device chip to said pins other than said respective pins.

4. The device defined in claim 1 wherein said permanent magnet comprises
   a pair of permanent bar magnets and
   a pair of sheets of magnetic material,
   said bar magnets being disposed adjacent the sides of said printed circuit layers, and
   said sheets of magnetic material extending between said bar magnets and facing the surfaces of said printed circuit layers.

5. The device defined in Claim 4 and further including a splitable closed container having engagable mating surfaces for supportably enclosing said bar magnetics and said sheets of magnetic material.

6. The device defined in claim 4 wherein
   one of said sheets of magnetic material is apertured to permit penetration by said pins without establishing electrical contact with said pins.

\* \* \* \* \*